(12) United States Patent
Warzecha et al.

(10) Patent No.: US 6,496,386 B2
(45) Date of Patent: Dec. 17, 2002

(54) METHOD AND SYSTEM FOR SHIELDING AN EXTERNALLY MOUNTED CIRCUIT BOARD FROM ELECTROSTATIC DISCHARGE AND MECHANICAL DAMAGE WHILE ALLOWING FOR HEAT EXCHANGE FROM HEAT-PRODUCING COMPONENTS OF THE CIRCUIT BOARD THROUGH THE CIRCUIT BOARD SHIELD INTO AN EXTERNAL ENVIRONMENT

(75) Inventors: Michal P. Warzecha, Roseville; Herbert J. Tanzer, Folsom; Timothy M. Sheridon, Rocklin, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/746,887

(22) Filed: Dec. 22, 2000

(65) Prior Publication Data

US 2002/0080591 A1 Jun. 27, 2002

(51) Int. Cl.$^7$ ................................................ H05K 9/00
(52) U.S. Cl. ........................ 361/816; 361/800; 361/818; 361/760; 361/761; 174/35 R; 174/35 GC; 174/35 MS
(58) Field of Search ................................. 361/800, 816, 361/818, 760, 761; 174/35 R, 35 GC, 35 MS

(56) References Cited

U.S. PATENT DOCUMENTS 6,018,461 A * 1/2000 Biermann et al. .......... 361/737

* cited by examiner

Primary Examiner—David Martin
Assistant Examiner—Thanh Y. Tran

(57) ABSTRACT

Method and system for shielding a circuit board from electrostatic discharge and from mechanical damage. A circuit board shield of dimensions roughly equivalent to those of the circuit board that the circuit board shield is designed to protect is manufactured to contain apertures complementary in shape, size, and position to heat-producing components affixed to the surface of a circuit board. When the circuit board shield is placed on top of the circuit board, the heat-producing components of the circuit board remain exposed to an external environment via the apertures, while other parts of the circuit board are protected from electrostatic discharge and mechanical damage by the overlying circuit board shield.

18 Claims, 2 Drawing Sheets

METHOD AND SYSTEM FOR SHIELDING AN EXTERNALLY MOUNTED CIRCUIT BOARD FROM ELECTROSTATIC DISCHARGE AND MECHANICAL DAMAGE WHILE ALLOWING FOR HEAT EXCHANGE FROM HEAT-PRODUCING COMPONENTS OF THE CIRCUIT BOARD THROUGH THE CIRCUIT BOARD SHIELD INTO AN EXTERNAL ENVIRONMENT

TECHNICAL FIELD

The present invention relates to circuit board protective technologies and, in particular, to a method and system for shielding a circuit board from electrostatic discharge without significantly inhibiting heat exchange between heat-producing components of the circuit board and an external environment.

BACKGROUND OF THE INVENTION

It is common practice in the electronics industry to externally mount circuit boards on electromechanical components. As one example, FIG. 1 illustrates a circuit board that implements a disk drive controller externally mounted to a disk drive enclosure. The circuit board 101 has a relatively flat surface studded with various components 102–112, including integrated circuits, that rise above the surface of the circuit board 101. These raised components 102–112 are generally encased in ceramic shells that protect enclosed internal electronic circuitry from damage arising from electrostatic discharge as well as from abrasion and other mechanical damage. However, many of these components 102–112 produce significant amounts of heat, and are mounted on the exterior surface of the circuit board to allow the heat produced by the components 102–112 to easily exchange with an air stream forced over the surface of the circuit board 101 or with ambient air via convective cooling. The circuits printed onto the circuit board 101 as well as other smaller components affixed to the surface of the circuit board (not shown in FIG. 1) are not protected from electrostatic discharge or mechanical insult.

The circuit board is often directly mounted to an underlying electromechanical component. In FIG. 1, the circuit board 101 is mounted to a hard disk drive enclosure 113. External mounting of the circuit board has the advantage of exposing the heat-producing components 102–112 mounted to the circuit board 101 to an air stream or to ambient air external to the electromechanical component enclosure 113 to allow for cooling of the heat-producing components, but has the serious disadvantage of exposing the printed circuit board 101 to electrostatic discharge and mechanical damage installation of the electromechanical component from, a computer system or disk array.

Various methods have been used to alleviate the above-described disadvantage inherent in externally mounted circuit boards. One techniques involves enclosing the circuit board in a metal casing, although this technique has the disadvantage of considerably increasing the volume of the disk drive enclosure, since an air gap must be left between the metal casing and the circuit board through which air can be forced to cool the heat-producing components mounted to the circuit board. Thus, designers, manufacturers, and users of electromechanical devices having externally mounted circuit boards have recognized the need for a cost-effective and space-efficient method for protecting the externally mounted circuit boards from electrostatic discharge and mechanical damage.

SUMMARY OF THE INVENTION

The present invention provides a method and system for shielding a circuit board from electrostatic discharge and from mechanical damage. A circuit board shield that represents one embodiment of the present invention comprises a flat, plastic plate, including a thin, embedded conductive film or mesh with external dimensions roughly equivalent to those of the circuit board which the shield is designed to protect. The shield includes apertures at locations complementary to the locations of each heat-producing component affixed to the circuit board and having shapes and sizes complementary to the shapes and sizes of the corresponding circuit board components. The circuit board shield is thus designed to closely conform to the external surface of the circuit board, so that, when the circuit board shield is mounted on top of the circuit board, the various heat-producing components affixed to the circuit board fit into complementary apertures of the circuit board shield. The circuit board shield protects the surface of the circuit board from electrostatic discharge, via the embedded conductive film or mesh, and protects the surface of the circuit board from mechanical damage. The apertures within the shield allow heat-producing components affixed to the circuit board to remain exposed to the external environment, despite placement of the circuit board shield on top of the circuit board. The exposed components are protected from electrostatic discharge and from mechanical damage by their own protective enclosures.

DETAILED DESCRIPTION OF THE INVENTION

One embodiment of the present invention is a circuit board shield complementary in shape and size to the external surface of a circuit board that can be securely mounted on top of the circuit board in order to protect the circuit board from electrostatic discharge and from mechanical damage. The circuit board shield includes apertures complementary in locations, shapes, and sizes, to heat-producing components affixed to the surface of the circuit board on top of which the circuit board shield is mounted. These apertures serve to expose the heat-producing components affixed to the circuit board to the external environment for heat exchange despite the presence of the circuit board shield in close proximity to, or in direct contact with, the circuit board protected by the circuit board shield.

Figure 1:
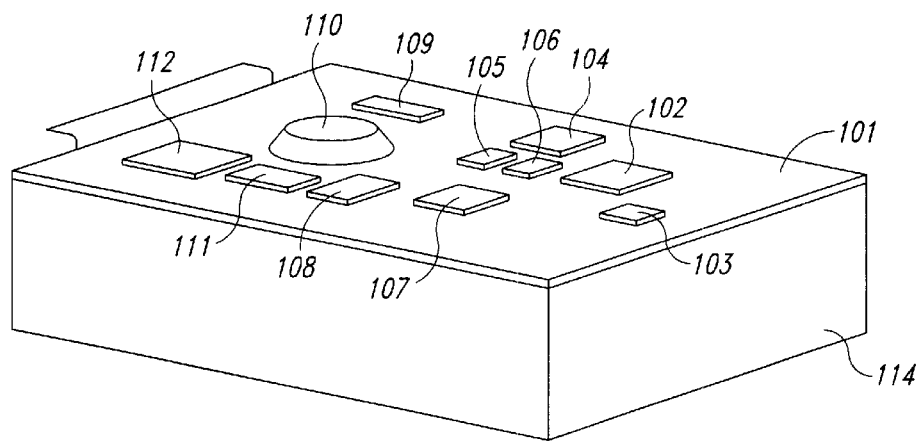
FIG. 1 illustrates a circuit board that implements a disk drive controller externally mounted to a disk drive enclosure.
Figure 2:
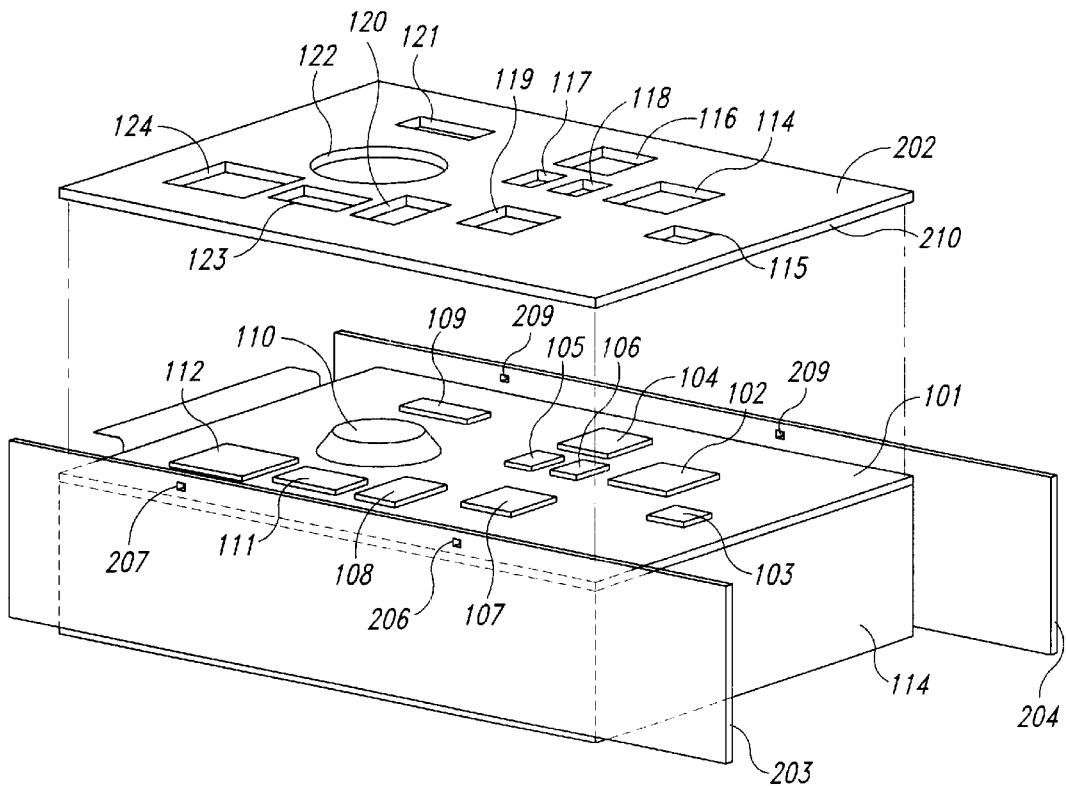
FIG. 2 illustrates a circuit board shield, representing one embodiment of the present invention, positioned above a circuit board prior to mounting.

FIG. 2 illustrates a circuit board shield, representing one embodiment of the present invention, positioned above a circuit board prior to mounting. The circuit board shield 202 is manufactured from a plastic polymer and includes an embedded conductive element, such as a thin metallic film or a thin metal mesh. In one embodiment, the circuit board shield is approximately one millimeter thick. The circuit board shield 202 includes, for each heat-producing component 102–112 affixed to the circuit board 101, a complementary aperture 114–124. For smaller, non-heat-producing components that rise slightly above the surface of the circuit board 101 (not shown in FIG. 2), complementary relief may be designed into the lower surface of the circuit board shield 202 to allow the circuit board shield 202 to closely conform to the external surface of the circuit board 101. Two vertical sheet metal mounts 203 and 204 are affixed to the electromechanical device enclosure 113. In one embodiment of the present invention, the vertical sheet metal mounts each include two snap tabs 206–207 and 208–209. The circuit board shield 202 may optionally include an electrostatic guard ring 210 laminated to the perimeter of the circuit board shield.

Figure 3:
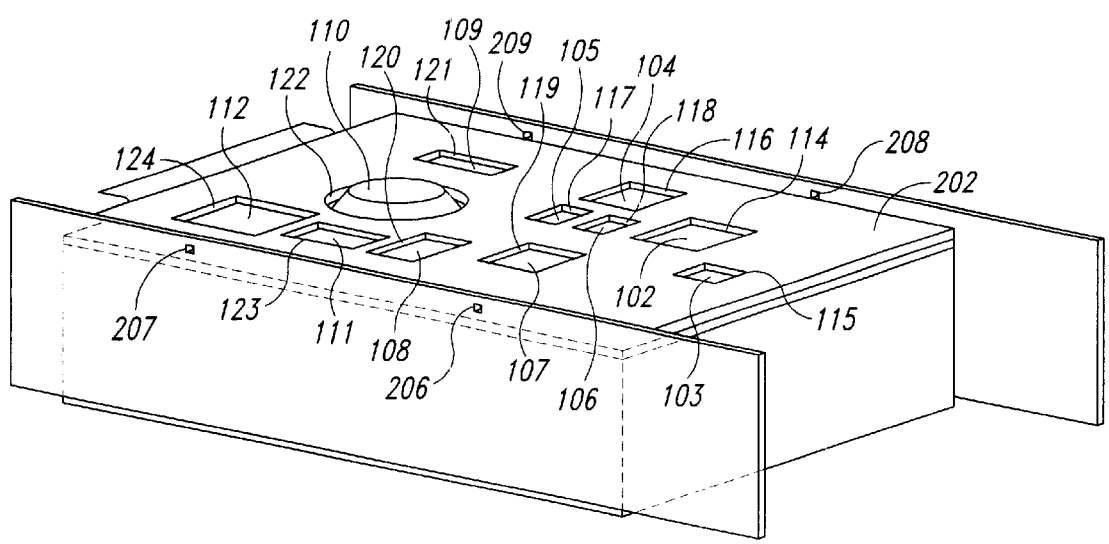
FIG. 3 illustrates the circuit board shield of one embodiment of the present invention securely mounted over the circuit board that the circuit board shield is designed to protect from electrostatic discharge and mechanical damage.

FIG. 3 illustrates the circuit board shield of one embodiment of the present invention securely mounted over the circuit board that it is designed to protect from electrostatic discharge and mechanical damage. The circuit board shield 202 has been pushed past snap tabs 206–207 and 208–209 to be securely mounted to the surface of the printed circuit board (obscured from view in FIG. 3). Heat-producing components affixed to the surface of the circuit board 102–112 are externally visible through complementary apertures 114–124 included in the circuit board shield 202. Note that the apertures 114–124 do not reach chip leads that electrically couple the components 102–112 to the circuit board. Thus, the apertures 114–124 do not result in exposure of chip leads or other sensitive circuit board components to either electrostatic discharge or to mechanical damage. In some cases, components are sufficiently large to protrude through circuit board shield apertures. In other cases, the exposed component surface is flush with, or below the level of the circuit board shield surface. Note also that the circuit board shield 202 needs to be specifically designed to shield a particular circuit board.

Although the present invention has been described in terms of a particular embodiment, it is not intended that the invention be limited to this embodiment. Modifications within the spirit of the invention will be apparent to those skilled in the art. For example, a circuit board shield may be manufactured from many types of polymers or other mechanically rigid but slightly flexible bulk materials. The described embodiment includes two vertical sheet metal mounts with snap tabs affixed to an electromechanical device enclosure that facilitate mounting of the circuit board shield to the surface of a circuit board mounted to the electromechanical device enclosure. However, many other types of mounting systems may be employed, including tabs or guides directly affixed to the circuit board. Different types of conductive materials, including non-metallic conductors, may be incorporated into the circuit board shield to provide required electrostatic discharge protection. The above-described circuit board shield is flat, but in alternative embodiments may feature a downward-curved rim or casing to allow the circuit board shield to be mechanically secured over the circuit board that it protects. In some embodiments, a narrow gap may separate the mounted circuit board shield from the underlying circuit board that it protects, while in other embodiments, the circuit board shield may directly contact the surface of the underlying circuit board. The described embodiment shields a disk drive controller, but the present invention may be employed to shield any number of different types of circuit boards mounted to, or within, any number of different types of components and systems.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A circuit board shield that protects a circuit board from electrostatic discharge and mechanical shock, the circuit board shield comprising:
   a plate, containing an embedded electrically conductive element that acts as an electrostatic shield, having a shape and size complementary to the shape and size of the circuit board;
   apertures within the plate having locations, shapes, and sizes complementary to the locations, shapes, and sizes of heat-producing components affixed to an upper surface of the circuit board;
   mounts that facilitate mounting a lower surface of the plate over the top of the upper surface of the circuit board so that the heat-producing elements of the circuit board directly underlie the apertures.

2. The circuit board shield of claim 1 further including:
   depressions in the lower surface of the plate complementary in locations, shapes, and sizes to the locations, shapes, and sizes of small, non-heat-producing components affixed to the upper surface of the circuit board that allow the plate to be mounted closer to the circuit board than the width of the small, non-heat-producing components.

3. The circuit board shield of claim 1 wherein a portion of the lower surface of the plate, when mounted over the circuit board, directly contacts a portion of the circuit board.

4. The circuit board shield of claim 1 wherein no portion of the lower surface of the plate, when mounted over the circuit board, directly contacts any portion of the circuit board.

5. The circuit board shield of claim 1 wherein a number of the heat-producing components protrude into their complementary apertures when the plate is mounted over the circuit board.

6. The circuit board shield of claim 1 wherein a number of the heat-producing components protrude through their complementary apertures when the plate is mounted over the circuit board.

7. The circuit board shield of claim 1 further including an electrostatic guard ring.

8. The circuit board shield of claim 1 wherein the embedded conductive element is a conductive mesh.

9. The circuit board shield of claim 1 wherein the embedded conductive element is a thin conductive film.

10. A method for protecting a circuit board from electrostatic discharge, the method comprising:
    providing a plate, containing an embedded electrically conductive element that acts as an electrostatic shield, having a shape and size complementary to the shape and size of the circuit board;
    providing apertures within the plate having locations, shapes, and sizes complementary to the locations, shapes, and sizes of heat-producing components affixed to an upper surface of the circuit board; and mounting a lower surface of the plate over the top of the upper surface of the circuit board so that the heat-producing elements of the circuit board directly underlie the apertures.

11. The method of claim 10 further including:

providing depressions in a lower surface of the plate complementary in locations, shapes, and sizes to the locations, shapes, and sizes of small, non-heat-producing components affixed to the upper surface of the circuit board that allow the plate to be mounted closer to the circuit board than the width of the small, non-heat-producing components.

12. The method of claim 10 further including mounting the plate over the circuit board so that a portion of the lower surface of the plate directly contacts a portion of the circuit board.

13. The method of claim 10 further including mounting the plate over the circuit board so that no portion of the lower surface of the plate directly contacts any portion of the circuit board.

14. The method of claim 10 further including mounting the plate over the circuit board so that a number of the heat-producing components protrude into their complementary apertures when the plate is mounted over the circuit board.

15. The method of claim 10 further including mounting the plate over the circuit board so that a number of the heat-producing components protrude through their complementary apertures when the plate is mounted over the circuit board.

16. The method of claim 10 further including providing an electrostatic guard ring along the perimeter of the plate.

17. The method of claim 10 wherein the embedded conductive element is a conductive mesh.

18. The method of claim 10 wherein the embedded conductive element is a thin conductive film.

* * * * *